(12) United States Patent
Johansson et al.

(10) Patent No.: US 6,337,532 B1
(45) Date of Patent: Jan. 8, 2002

(54) FINE WALKING ACTUATOR

(75) Inventors: Stefan Johansson; Mats Bexell; Per Oskar Lithell, all of Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 0 days.

(21) Appl. No.: 09/637,787

(22) Filed: Aug. 11, 2000

(51) Int. Cl.$^7$ .............................................. H01L 41/08
(52) U.S. Cl. .............. 310/323.02; 310/328; 310/316.01
(58) Field of Search ........................... 310/323.02, 328, 310/316.01, 316.02

(56) References Cited

U.S. PATENT DOCUMENTS

| | | | |
|---|---|---|---|
| 5,136,200 A | * 8/1992 | Takizawa et al. | 310/323.02 |
| 5,345,137 A | * 9/1994 | Funakubo et al. | 310/323.02 |
| 5,378,948 A | * 1/1995 | Richter | 310/328 |
| 5,453,653 A | * 9/1995 | Zumeris | 310/323.02 |
| 5,633,554 A | * 5/1997 | Kaji | 310/328 |
| 6,184,609 B1 | * 2/2000 | Johansson et al. | 310/328 |
| 6,066,911 A | * 5/2000 | Lindemann et al. | 310/323.02 |

* cited by examiner

*Primary Examiner*—Mark O. Budd
(74) *Attorney, Agent, or Firm*—Young & Thompson

(57) ABSTRACT

The present invention discloses an electromechanical actuator arrangement (10) and a method for driving such arrangement, having a plurality of drive elements (14a–d) according to a walking mechanism in a motion relative a body (22). A driving portion of the drive elements (14a–d) are independent movable tangentially and normally to the body (22) surface. The drive elements (14a–d) are driven in the fours cycle steps; gripping, moving the body, releasing and returning to the original position. The drive elements (14a–d) are divided into two exclusive sets. The driving of the sets is phase shifted. At least one of the sets is in contact with the body (22) surface at each instant. The present invention is characterised in that the driving of the drive elements (14a–d) during the gripping sequence is performed in such a way that the drive elements (14a–d) have a velocity, which has a significant tangential component.

24 Claims, 7 Drawing Sheets

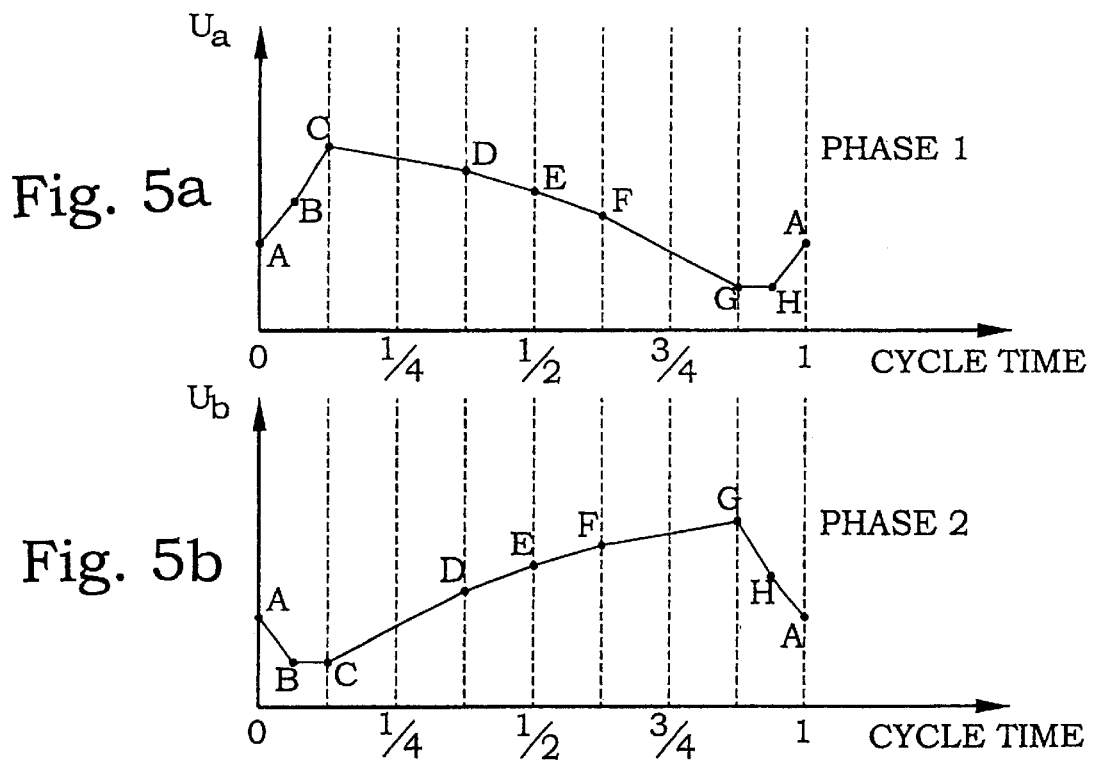
Fig. 5a
Fig. 5b
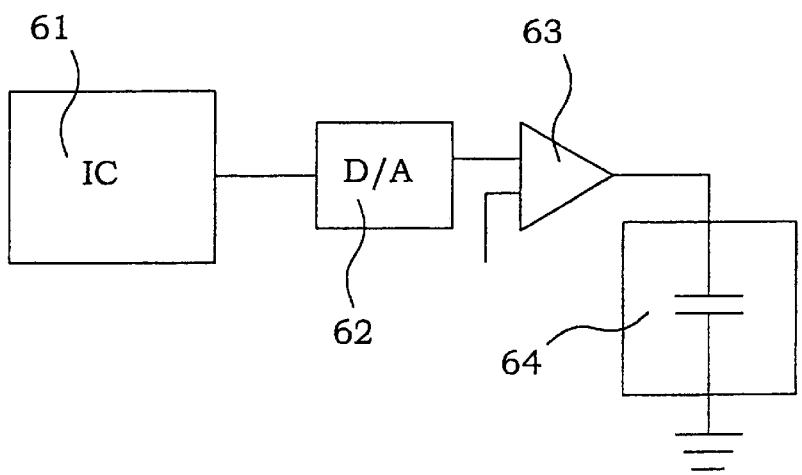
Fig. 7

FINE WALKING ACTUATOR

TECHNICAL FIELD

The present invention relates to electromechanical actuators having non-dynamic or pseudo-static driving mechanisms and the control and driving of such actuators.

BACKGROUND

The small motor market has been increasing continuously for decades and there is a particular interest in high performance miniature motors that can be fabricated at low costs. Force and precision are the typical main properties of importance. Common electric motors have in some applications reached their limits and alternatives are being developed. This invention relates to the need for high performance miniature motors.

Electromechanical motors, comprising e.g. piezoelectric motors, is a more and more used type of miniature motors. Piezoelectric actuators are today well known and used in a wide variety of applications. Piezoelectric actuators are generally characterised by a high momentum but a small stroke. By repeating the motion with a high frequency, macroscopic strokes can be achieved. There are a number of fundamentally different operation mechanisms used in electromechanical motors. By using the inertia of some motor component and/or time dependent physical effects, various electromechanical motors can be realized. This group of driving mechanisms may be referred to as dynamic driving mechanisms. Typically, motors with dynamic driving mechanisms can only operate in a certain frequency range, while no operation at low internal speed or frequency is possible. The commonly encountered names ultrasonic and travelling wave motors belong to this group of dynamic driving mechanisms.

Another group of driving mechanisms can be denoted as non-dynamic, static or quasi-static. These non-dynamic mechanisms are characterised in that the motion can be made at arbitrarily low frequencies or speed of the active elements. The driven component is moved by actuator elements which typically make motion cycles such as grip, move, release and return. When one set of elements is releasing, another set of elements will grip the driven component. Typically, the non-dynamic mechanisms are advantageous where controlled positioning is desired at low to medium-high speeds. Further this mechanism allows for easy optimisation in various applications and gives the possibility to deliver high forces. The main disadvantage is the high demands on the construction in order to achieve the desired mechanism. Various solutions to simplify the constructions without losses in performance are therefore generally of great commercial interest.

One mechanisms for non-dynamic motion is the "inch-worm" mechanism, first disclosed in the patent U.S. Pat. No. 3,902,084. The driven component is moved by mechanical steps in a clamp-extend-unclamp fashion, e.g. in U.S. Pat. No. 5,751,090. There has to be at least two sets of clamping elements that move out of phase. In between each motion, the extention, the driven components is clamped by both sets of elements and stands still. The motion is cyclic and the ultimate resolution corresponds to one step length divided by the voltage resolution. The driven component can in some cases be stopped at fractions of the full step length, a kind of micro-step mode. The clamping and unclamping takes place during a non-motion phase.

In the international patent application WO 97/36366 a piezoelectric motor based on a non-dynamic driving mechanism is disclosed. The mechanism is an alternative to the "inch-worm" mechanism and could be denominated a "mechanical stepping mechanism". The motor is made of an electromechanical material as a monolithic multilayer unit with at least two independent sets of drive elements that can move two-dimensionally. The motion of each set is characterised by the four sequences of gripping, moving, releasing and returning. Voltages cycles are applied to the sets of bimorph drive elements, which are out of phase with each other. In the application the preferred voltage cycles were stated to be sinusoidal. Such drive cycles result in elliptical motion trajectories of the contact points of the drive elements. With two element sets phase shifted 180 degrees, the tangential speed of the elements at the instant when one set is gripping and the other is releasing is essentially zero.

Prior art non-dynamically driven electromechanical motors exhibit large advantages. However, some minor disadvantages are still present. One is the problem of achieving controlled stepping with extremely small step lengths, while the quasi-static control of driving still is maintained. Another general problem is that the tangential speed varies constantly during the drive cycle which sometimes results in problems such as wear and vibrations. Further, in a similar way, the normal motion will also vary which apart from creating vibrations and affecting the friction also results in unnecessary power consumption. While the tangential motion can be used for useful work, the normal motion is only necessary to overcome surface irregularities etc. and is not used for power output. A particular problem with the disclosed "mechanical stepping mechanism" device is that the sinusoidal voltage cycles do not make use of the full possible stroke of the elements, which lowers the efficiency.

In ultrasonic motors the wear of the contact surfaces is a non-negligible problem. Several solutions to the problems have been suggested including polymer surface and lubrication. The wear of a non-resonant motor is less due to the more controlled motion of the drive elements. However, when high performance nature motors are considered, also a minor wear might affect the performance.

There are numerous ways to make piezoceramic motors according to the present invention but with prior art solutions it is difficult to achieve small size, high forces and low price at the same time.

SUMMARY

A general object of the present invention is to provide an improved electromechanical motor, having a non-dynamic or pseudo-static driving mechanism. A further object is to utilise the geometrical motion possibilities of the driving elements in an optimal manner. Another object is to provide a motor with an even motion at constant speed as well as at acceleration or retardation. Yet another object with the present invention is to improve the positioning precision of electromechanical motors, in particular to achieve extremely small step lengths that easily can be used in closed-loop applications with a suitable position sensor. It is also an object to reduce the power requirements as well as improving the precision and force in relation to the volume of the active elements. Yet a further object is to provide an electromechanical motor with improved geometrical and material selections as well as improved frictional properties. Also improved guiding of the driven body and the application of normal force is an object.

The above objects are achieved by devices and methods according to the enclosed claims. In general words, the invention provides a method for driving an electromechanical actuator arrangement having a plurality of drive elements according to a waling mechanism in a motion relative a body. A driving portion of the drive elements are independent movable along and perpendicular to the surface of said body, i.e. in a tangential and normal direction, respectively. According to the method the drive elements are driver in the fours cycle sequences; gripping the body, moving the body, releasing the body and returning to the original position. The drive elements are divided into at least two exclusive sets. The driving of the second set is phase shifted related to the driving of the first set. At least one of the sets is in contact with the body surface at each instant. The method according to the present invention is characterised in that the driving of said first and second set of drive elements during the gripping sequence is performed in such a way that the drive elements have a velocity which has a significant component in the main motion direction. In other words, during the gripping, the driving portion moves with a tangential velocity component.

In preferred embodiments, the driving of the drive elements is performed to make an overlap between the gripping and releasing sequences, respectively, of the two sets. The motion and in particular the tangential velocity component of the drive elements are preferably performed according to a application specific velocity schedule, in particular during the gripping, moving and releasing sequences. One embodiment has a pure tangential motion during the moving sequence. According to one embodiment of the invention, the motion cycle is possible to divide into microsteps, in order to be able to halt the motion at any position. A preferred embodiment also enables a variable step length of the driving cycle.

According to another aspect of the present invention, an electromechanical actuator is presented, which is possible to drive according to the above method. Furthermore, preferred embodiments comprise active portions and connecting passive portions of a monolithic body. The passive portion comprises additional electrode layers, which either are connected to ground, for improving thermal conductivity. Furthermore, the driving portions are made by a material with high thermal conductivity. The sets are also substantially symmetrical with respect to the centre of said electromechanical actuator arrangement.

The present invention introduces several advantages, compared with prior art. The geometrical dimensions are utilised more efficient. The motion of the body is possible to make smooth. The precision of the positioning is enhanced. Furthermore, the energy consumption is reduced.

BRIEF DESCRIPTION OF THE DRAWINGS

The invention, together with further objects and advantages thereof, may best be understood by Making reference to the following description taken together with the accompanying drawings, in which:

FIG. 5, is a diagram illustrating electrode voltages necessary to obtain motion trajectories according to FIG. 4;

FIG. 7 illustrates an electronic drive device suitable for the present invention;

DETAILED DESCRIPTION

Most actuator materials could be characterised as electromechanical materials, but in the present disclosure we intend materials that change their shape when an electric voltage or current is applied. Typical examples of electromechanical materials are piezoelectric, electrostrictive and antiferroelectric materials and these materials could be single crystalline as well as polycrystalline or amorphous. The materials of greatest interest today are polycrystalline multilayer ferroelectric ceramic materials with large electromechanical strains, but there is an ongoing development of polymer and polymer composite materials that might result in competitive properties.

Electromechanical motors and actuators, and in particular piezoelectric motors and actuators, are available in a huge number of varieties. One way to classify the devices is to divide them according to their driving mechanism. The features and problems of the devices are often specific for each group or sub-group. One solution applied to a motor device of a particular driving mechanism may be totally irrelevant for other types. In the present invention, electromechanical devices having a non-dynamic or pseudo-static driving mechanism are considered. For a better understanding of the common driving mechanisms, a brief report on different mechanisms is given in appendix 1. A common property of non-dynamic mechanisms and pseudo-static mechanisms, is that controlled quasi-static walking can be achieved and in the following references are made to "waling mechanisms".

A walking mechanism is thus characterised by two driving element sets that move a body sequentially by shape changes of the elements, utilising direct contact between the element and the body, and where the set in contact with the body operates quasi-statically.

In the present invention, an electromechanical motor or actuator comprises at least two sets of actuator elements. Each set comprises at least one element. The elements are preferably bimorphous elements being able to position its contact point in two independent directions Preferably, the elements are puts of a monolithic body, as in WO 97/36366, but other solutions are also possible. First, the basic structure is described, then the manufacturing of such units will briefly be related, and finally the typical motion will be discussed more in detail.

Figure 1:
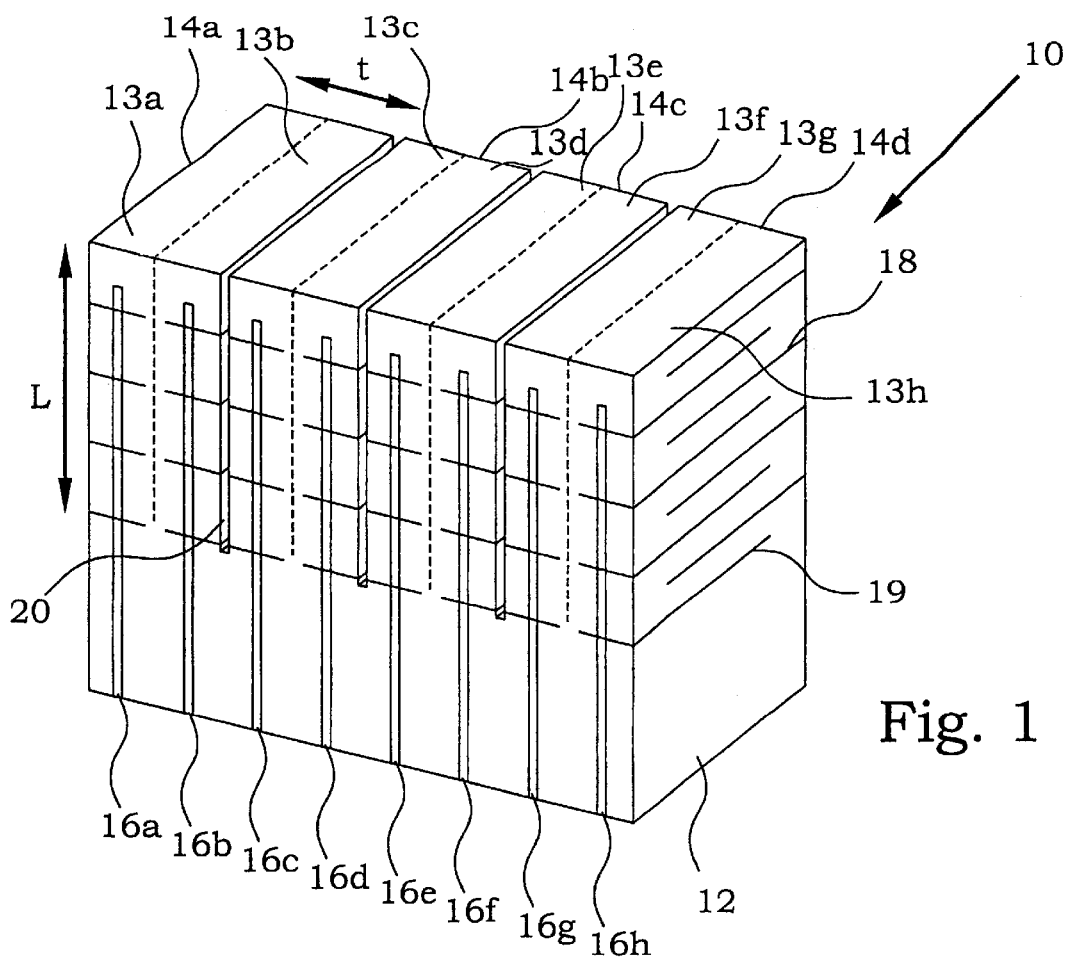
FIG. 1 is a schematic illustration of a monolithic piezoelectric drive unit that can be used in the present invention.

A monolithic multilayer unit 10 is shown in FIG. 1. The unit 10 comprises a passive backing 12 and drive elements, in this case four drive elements 14a–d, separated by cuts 20. Each drive element is divided into two separately controllable phase segments 13a–h. A number of phase electrode layers 19 and earth electrode layers 18 are incorporated within the drive elements 14a–d, and electrodes 16a–h contact the phase electrode layers 19 in the active areas in the drive elements 14. Each phase electrode 16a–h corresponds to one phase segment (13a–h). A similar contactation is present on the (not shown) rear side for the earth electrode layers 18. By applying a suitable voltage to selected electrodes 16, electrical fields will be applied within the drive elements and result in a expansion or contraction of the material between the phase electrode layers 19 and earth electrode layers 18, This will result in a bending and/or expansion/contraction of the drive elements 14. How this drive element motion is translated to a motion of an object in contact with the unit 10 will be described more in detail below.

The unit is possible to manufacture by prior art techniques, e.g. wet building of piezoceramic slurry combined with screen printing of electrode paste, but other manufacturing techniques might as well be used. In brief, the fabrication could be described as follows, On a glass plate, layers of a slurry consisting of piezoceramic powder, a binder, a dispersant and a solvent is cast with e.g. a doctors blade. The slurry is allowed to dry by forced convention. Since the structure should be divided in a passive backing 12 and drive elements 14 the casting will be slightly different for these parts. The first layers will become the passive backing 12 and in the normal case there is no need for electrodes in this region so that another layer of slurry is cast on top of the previously cast and dried layer. The slurry is allowed to dry and the process is repeated until a sufficiently thick, typically about 1–3 mm passive backing is cast. In between the following layers, electrode patterns of e.g. Pt or AgPd paste will be screen-printed, using two different masks. One mask is used for the phase electrode layers 16 and another mask for the earth electrode layers 18 and they will be used alternatingly. The casting is typically made over a surface of some square decimeters and the masks could be aligned by centering pins. After the casting is complete the whole green body is divided in units 10 using e.g. a dicing saw and at the same time the division of drive elements 14 are made by cuts 20 with the same depth as the desired length of a drive element 14. The unit 10 is heat treated, first at some 600–700° C. to remove the organic material and then at about 1000–1300° C. to sinter the material to a monolithic unit. After sintering, e.g. silver electrodes 16 are printed on both sides. The eight electrodes 16a–h contact the phase electrode layers 16 in the active areas in the drive elements 14. The earth side is not shown but is analogous to the phase electrode side except that all layers are connected. The drive elements operate as bimorphs and therefore there are two different active areas in each drive element 14, as indicated by a broken line. The silver paste is heat treated to form solid Ag electrodes 16 on the sides of the unit 10.

The mechanism for moving a driven component by such a unit is of a non-dynamic type. For a description, references are made to FIG. 2. Here the same type of unit 10 as in FIG. 1 is illustrated, but with certain details removed to simplify the readability. We can consider the monolithic unit 10 in FIG. 2 as consisting of two sets of driving elements that operate independently. Let us choose drive element 14a and 14c as the driving elements of the first set. These drive elements 14a, 14c are thus working synchronously. These drive elements 14a, 14c are in contact with a driven component, in this case a rail 22. Similarly, drive element 14b and 14d belongs to a second set These drive elements 14b, 14d are thus also working synchronously. These drive elements 14b, 14d are not in contact with the rail 22 in the illustration. The drive elements 14 are bimorphs with independently controllable voltages on the two sides of the bimorph. The top of the drive elements 14, the contact points 28, can therefore move arbitrarily within a certain area, if no load is present. For an ideal bimorph and for small strokes, this area constitutes a rhombic. For a certain phase-shifted motion of the two sets of drive elements, a motion of the rail 22 according to the arrow 26 is possible to achieve.

In the remaining part of the present disclosure, "rail" will refer to any body that is held against the drive elements in order to be moved relative to these drive elements. For applications, where a linear motion is requested, the "rail" is preferably substantially flat. However, for rotating applications, the "rail" may be curved and even have a circular cross section.

Figure 3A:
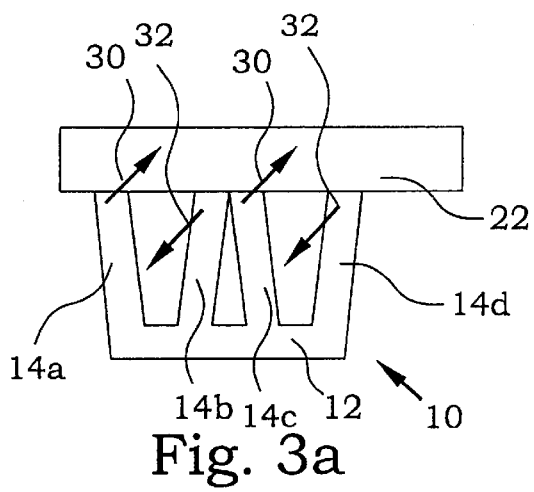
FIGS. 3a–d are schematic illustrations of a simple motion according to the present invention.

The basic ideas of a motion are illustrated in the FIGS. 3a to 3d. All motions of the drive elements are exaggerated enormously in these figures in order to visualize the mechanism. In FIG. 3a, a situation when all drive elements 14 are in contact with the rail 22 is illustrated. The elements of the first set are bent to the left and the elements of the second set are bent to the right. From this situation, the elements of the first set, i.e. drive element 14a and 14c are forced in the direction of the arrows 30, i.e. in an upper right direction. The elements of the second set, i.e. drive element 14b and 14d are instead forced in the direction of the arrows 32, i.e. in a lower left direction. This means that the drive elements of the second set will loose its contact with the rail 22, and the rail 22 follows the motion of the contact points of the drive elements of the first set.

Figure 3B:
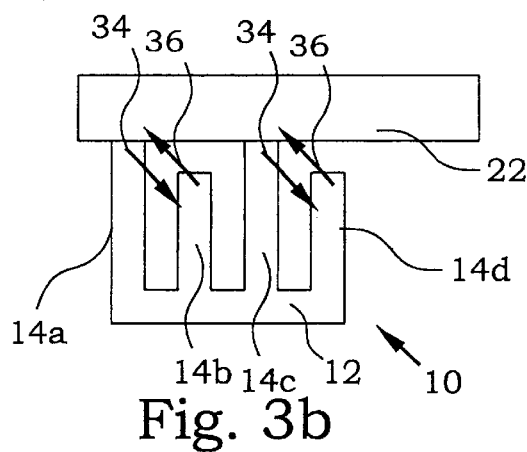

After some time, the situation in FIG. 3b is reached. The elements 14 are now changing its motion. From this situation, the elements of the first set, i.e. drive element 14a and 14c are forced in the direction of the arrows 34, i.e. in a lower right direction. The elements of the second set, i.e. drive element 14b and 14d are instead forced in the direction of the arrows 36, i.e. in an upper left direction. This means that the drive elements of the second set eventually will come into contact with the rail 22 again.

Figure 3C:
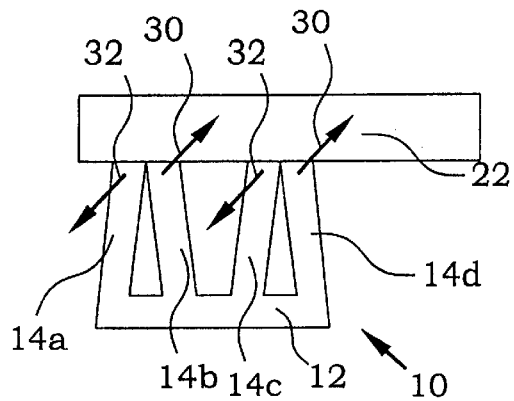

This situation is illustrated in FIG. 3c, i.e. all elements are again in contact with the rail 22, but the second set at a slightly different position. From this situation, the elements of the second set, i.e. drive element 14b and 14d are forced in the direction of the arrows 30, i.e. in an upper right direction. The elements of the first set, i.e. drive element 14a and 14c are instead forced in the direction of the arrows 32, i.e. in a lower left direction. This means that the drive elements of the first set now will loose its contact with the rail 22, and the rail 22 follows the motion of the contact points of the drive elements of the second set instead.

Figure 3D:
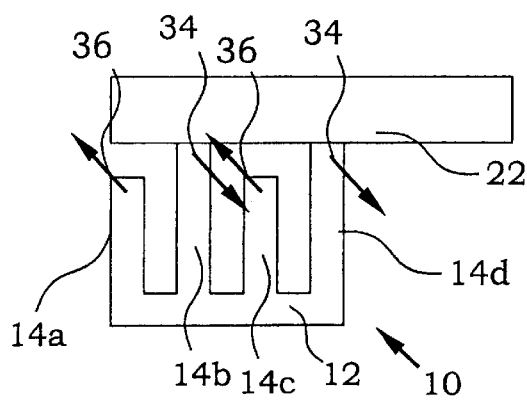

After some time, the situation in FIG. 3d is reached. The elements 14 are now changing its motion. From hiss situation, the elements of the second set, i.e. drive element 14b and 14d are forced in the direction of the arrows 34, i.e. in a lower right direction. The elements of the first set, i.e. drive element 14a and 14c are instead forced in the direction of the arrows 36, i.e. in an upper left direction. This means that the drive elements of the second set eventually will come into contact with the rail 22 again, and the cycle is repeated. The result will be a transportation of the rail to the right in the figure.

The four characteristic sequences of the motion is easily distinguished. At the situation in FIG. 3a, the drive elements of the first set are in their gripping sequence. The moving sequence takes place between the FIG. 3a over FIG. 3b and to FIG. 3c. At the situation in FIG. 3c, the drive elements of the first set are in their releasing sequence. Eventually, The moving sequence takes placed between the FIG. 3c over FIG. 3d and to FIG. 3a. In theory, the gripping and releasing sequences could be almost indefinite short, but in reality, the gripping and releasing takes place during a certain time period.

Figure 2:
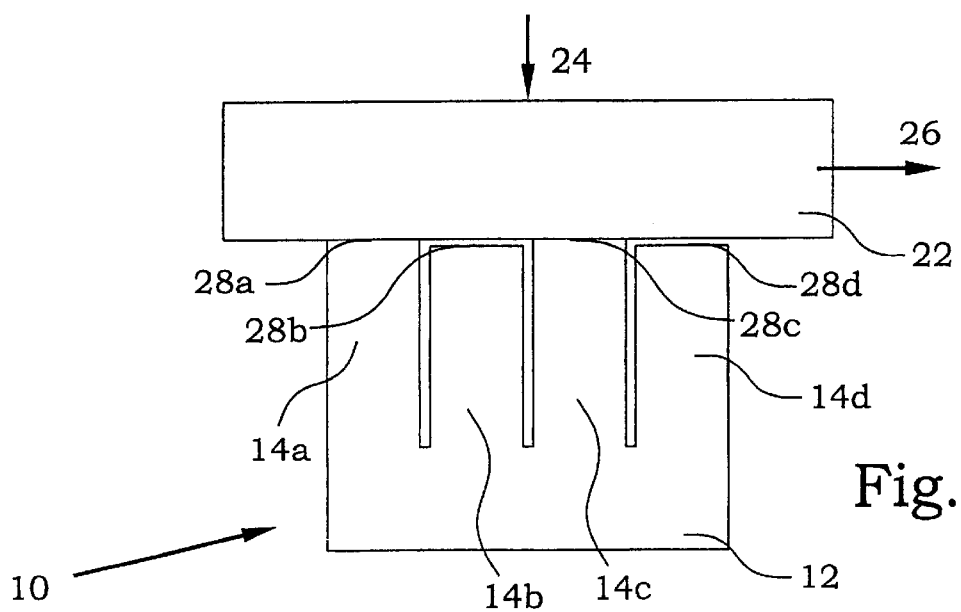
FIG. 2 is an illustration of how a drive unit of FIG. 1 is arranged for driving a body.

The common way to make a motor as in FIG. 2 is to apply a normal force 24 in the normal direction. In the following, linear motion 26 will mostly be used to exemplify the invention, but it is obvious that most of the solutions can be used in rotating, linear-rotating and linear-linear motors etc. Often a three point contact is desired in a rotating motor and therefore a typical rotating drive unit according to the non-dynamic drive mechanism will consist of six drive elements. However for both linear and rotating motors it is possible to use four, or which ever number larger than one, elements to get the desired drive mechanism provided that the guiding allows one set of elements to move freely when the other is holding the driven component.

The examples above are based on two sets of drive elements, typically phase shifted by 180 degrees. One may also use more than two sets of drive elements. One possibility would e.g. be to use three independent sets of drive elements, phase shifted by 120 degrees. Such an arrangement would give a situation, where two sets are i contact with the body to be moved during most of the time, while one is in a returning sequence. A higher force can thus be achieved, at the expense of more complex electronics and mechanical designs.

The size of the elements are chosen with respect to the application and the main factors to consider are the necessary drive element elongation, drive element step length and the load to carry. The elongation is determined by factors such as flatness and roughness of all drive surfaces as well as elastic deformation of all mechanical parts. With a rail flatness of 0.25 $\mu$m, a drive unit flatness of 0.25 $\mu$m and an elastic deformation of 0.50 $\mu$m the elongation should be larger than 1.0 $\mu$m and typically about 2.0 $\mu$m will be sufficient. Using materials with are able to achieve electromechanical strains of 0.07% at maximum operating voltage allowed, the length of the elements have to be at least 3 mm. The elements can be regarded as bimorphs, and if we in FIG. 1 consider e.g. element 14a, one side of the bimorph can be activated with Ag electrode 16a and the other with Ag electrode 16b (assuming that the earth electrodes are connected). The bimorph bending using one active side can be calculated from:

$$w = \frac{3L^2 s}{4t} \quad (1)$$

where L is the length of the drive element, t is the total thickness of the bimorph and s is the strain the activated layer can reach, as indicated in FIG. 1. With a thickness approximately as the length, the resulting bending motion will be approximately 1 $\mu$m in both directions which gives a step length of about 2 $\mu$m.

One of the main advantages with non-resonant mechanisms is the possibility to make controlled motion. Of aspect of this invention discloses a method to make a fine walking by proper electronic control. As has been commented previously, this invention is applicable to various types of non-resonant motors (rotating, linear, linear and rotating etc.) with two or more driving elements. With fine walking is intended real-time fine control of position, velocity or acceleration or preferably all at the same time. This should be interpreted that the position; velocity and/or acceleration can be fully controlled by the drive electronics in every instant (within the time resolution given by the control circuit). Previous disclosed non-dynamic electromechanical motors have been limited to mechanical stepping of predetermined length and fine positioning has been achieved by controlling the voltage during the extend phase in a clamp-extend clamp sequence. There are several advantages with this type of fine walking and the most obvious is high resolution positioning. Also, with the choice of velocity when an element set is gripping or releasing, a very smooth motion can be achieved. The method will be further explained and exemplified below.

First the two parameters step length and cycle period have to be defined. The motors are controlled of drive voltage cycles that in the most general case varies during the cycle period. Typically the behavior of the voltage cycle does not change within the cycle period and if we first consider a case with constant speed and constant load, the voltage cycle is constant. During each cycle period the drive elements make two steps together. One element set makes one step and the other element set makes another. If one element set would grip at exactly the same time as the other set releases, as in FIGS. 3a–d, then the movement during one cycle would correspond exactly to two full steps. However, there is in practice normally an overlap between the two steps and the motion during one cycle will then be less than the sum of two steps. To make it simple, the step length is the distance between the position when one element contact point contacts the rail and the position when the contact point of the other element makes contact with the rail.

Figure 4A:
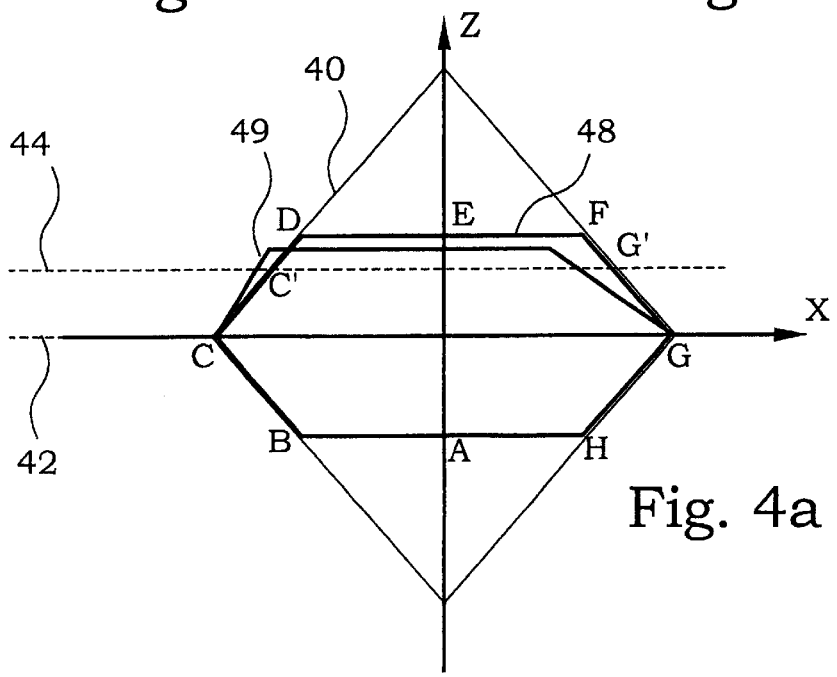
FIG. 4a is a diagram illustrating a motion trajectory according to the present invention.

If we now consider the contact point of just one of the elements, the controlled fine walking could be better understood. The motion field of a contact element without considering the normal forces from the rail etc., i.e. in an unloaded situation is shown in FIG. 4a. The z-axis is the normal direction and the x-axis is the tangential direction. The tangential direction is thus the main motion direction of the body to be moved. The outer, rhombic area 40 illustrates the maximum motion field of the bimorph contact point. By proper choice of the voltages of the two portions of the element all positions within this area 40 can be reached. There are two horizontal lines drawn in the figure, the first 42 represents the lowest position of the rail relative the contact point and the other 44 represents the uppermost position of the rail relative the contact point. We can consider this height range as the sum of all fabrication errors at this point. The motion from the line 42 to the line 44 thus constitutes the gripping sequence of a drive element. Similarly, the motion from the line 44 to the line 42 constitutes the releasing sequence of a drive element.

A trajectory 48 illustrates a motion of the element tip without the normal load from the rail. In position C the element might touch the rail if it is in the lowest position and if the tip is moved towards D the tip will have got into contact with the rail before the line 44 is reached, i.e. before C'. After being in friction contact with the rail the element wants to move further in the normal direction to reach D. In motor operation this will not be possible since the rail will not move freely in the normal direction due to applied normal forces and the clement will instead follow the rail surface. The whole system consisting of the monolithic unit, rail, springs, mechanical details etc. will deform elastically and the normal height corresponding to position D has to be chosen sufficiently above line 44. This deformation will be discussed further below.

The element thereafter strives to follow the trajectory passing position E towards position F, which will result in a pure tangential motion of the rail. The friction coefficient and normal force has of course to be large enough to overcome any tangential forces. If the element then moves to position G the element tip will release from the rail, at the earliest at G', and at the same time move slightly in the tangential direction. Assuming that there are negligible height errors, i.e. normal distance between 42 and 44, the step length can be considered to be the tangential distance between C and F. As can be understood from FIG. 4a, step lengths are controlled by the chosen trajectory adapted to the specific application parameters.

From G the element is withdrawn from the rail to position H, returning to the initial position C in this example through the intermediate positions A and B. Depending on whether the contact point follows the trajectory clockwise or counter-clockwise the motion direction of the rail will be forward or backward in the x-direction.

Figure 4B:
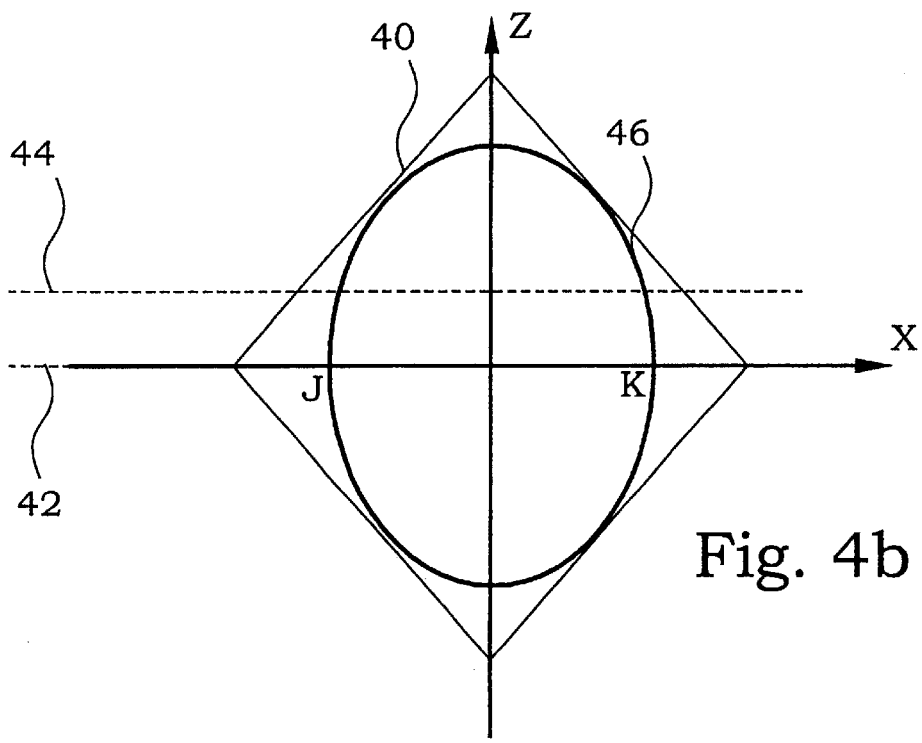
FIG. 4b is a diagram illustrating a motion trajectory according to prior art.

If the elements were to be controlled by sinusoidal voltages, a corresponding cycle trajectory would be an ellipse, e.g. the one denoted by 46 in FIG. 4b. It is here easily realized that the step length of such a trajectory corresponds to the horizontal half axis of the ellipse, i.e. the distance from J to K. It is also easily understood that the step length obtainable by a sinusoidal voltage cycle never can reach the same sizes as can be reached with corresponding voltages using rhombic trajectories. By using trajectories with a significant tangential component during the gripping and releasing sequences, larger step sizes are generally accomplishable. This is particularly true for bimorph drive elements.

A fair estimate of the relation between the trajectory and the voltages in the two phases in the bimorph is:

$$x(t) = k_1(u_b(t) - u_a(t))$$

$$z(t) = k_2(U_b(t) - u_a(t))$$

with $k_1$ and $k_2$ being constants depending on material, geometry etc. For a desired trajectory the voltages $u_a$ and $U_b$ of the two phases in the bimorph drive element can be written as:

$$u_a(t) = h_2 z(t) - h_1 x(t)$$

$$u_b(t) = h_2 z(t) + h_1 x(t)$$

with two constants $h_1$ and $h_2$.

The timing information for the drive cycle is as important and will be explained here. A further preferred characteristic feature of a motion trajectory of the present invention is that the trajectory is travelled with a varying speed. This means that one part of the trajectory not necessarily takes the same time to pass as another part with the same length. By varying the trajectory speed, at least a part of the gripping sequence of one set can be made to overlap with at least a part of the releasing sequence of the set, and also the opposite way around. By letting the trajectory travel from D to F take the same time as the trajectory travel from G to C, and by letting the trajectory speed from C to D be the same as from F to G, the gripping sequence of one set overlaps with the releasing sequence of the opposite set. By further using opposite slopes of the same magnitude, i.e. the same positive trajectory slope for the gripping sequence for one set as the negative trajectory slope for the other set, both element sets have the sane tangential motion component during these sequences. The actual transfer of contacting set will in such a way be performed in a smooth manner.

Using sinusoidal voltages, such trajectory speed adjustment is not possible, and the gripping and releasing sequences have to be performed at a substantially zero tangential speed. A similar smooth transfer between the contacting sets is not possible to perform.

The motion of the driving portion of the drive elements is well controlled. In particular, the velocity components in the main motion direction during the gripping, moving and releasing sequences are controlled according to a velocity schedule. During continuous motion, the velocity schedule is typically constant. However, this schedule is preferably changeable or adjustable also during the motion, in order to handle, e.g. acceleration or retardation motions or precision positioning.

Another way to express the Long of the motion is given in FIG. 5, where an example of how the voltages us and ub changes with time is illustrated. The tangential speed is an important parameter to consider. To avoid noise, wear etc. and keep a smooth motion in the tangential direction, the speed of the drive elements when being in contact with the rail should be adjusted in a particular manner. As an example we can consider constant speed at zero tangential load and in this case the tangential speed of the elements should be constant from positions C to G in FIG. 4a. With a constant tangential speed, the total speed in the "grip" C–D and "release" segments F–G has to be higher than the tangential speed since there is also a normal speed component. As have already been indicated above, the "grip" and "release" sequences in this innovation is not exactly identical with what has been disclosed previously, since there is also a controlled tangential speed during the gripping, but for simplicity the citation marks will be omitted in the following. The speed during the return segments G–C could be made at a much higher speed than segments when the drive element is in contact with the rail and the limiting speed will be correlated to dynamic effects in the drive elements. Tangential speed control during grip, move D–F and release segments gives a smooth motion of the rail.

In motors based on a walling mechanism there will be at least two different element sets with two different phases driving the elements in one set. One motor phase typically corresponds to one phase segment 13a–h (FIG. 1) of each drive element in a set. Normally a motor is driven by four phases, even though a motor could be driven by e.g. two or eight phases as is further described below. As an example, one phase could have a trapezoidal shape if the voltage of the phase is plotted as a function of cycle period. Typically the other phase in the same set is phase shifted a quarter of a period and the remaining two phases in the other set is phase shifted half a period relative to the two phases in the first set In some cases the phases might also differ in voltage level. In the general case, all phases might have completely different waveforms.

Figure 6A:
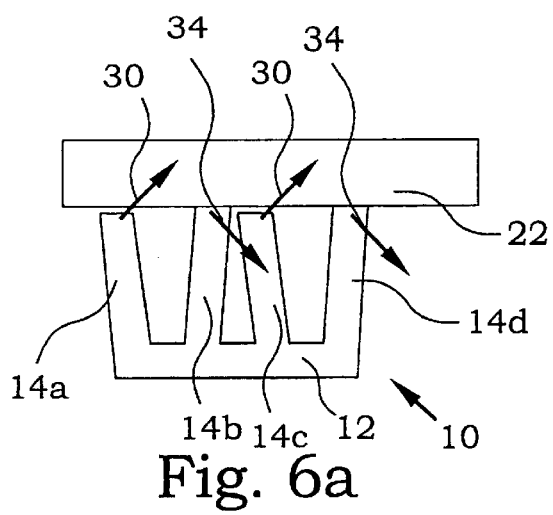
FIGS. 6a–e are schematic illustrations of a motion with overlapping gripping and releasing sequences according to the present invention.

In FIGS. 6a to 6e, a series of schematic illustrations of the above described overlap is shown. As before, all motions of the drive elements are exaggerated enormously in these figures in order to visualize the mechanism. In FIG. 6a, a situation when the first set of drive elements 14a, 14c are close to contact with the rail 22 and the second set is in contact with the rail 22 is illustrated. The elements of the first set are bent to the left as far as possible and the elements of the second set are bent to the right, but not the maximum stroke. From this situation, the elements of the first set, i.e.

drive element 14a and 14c are forced in the direction of the arrows 30, i.e. in an upper right direction. The elements of the second set, i.e. drive element 14b and 14d are instead forced in the direction of the arrows 34, i.e. in a lower right direction. This means that the drive elements of the first set will get into contact with the rail 22 and the drive elements of the second set instead will loose its contact with the rail 22. The rail 22 follows the motion of the contact points of the contacting drive elements to the right in the figure.

Figure 6B:
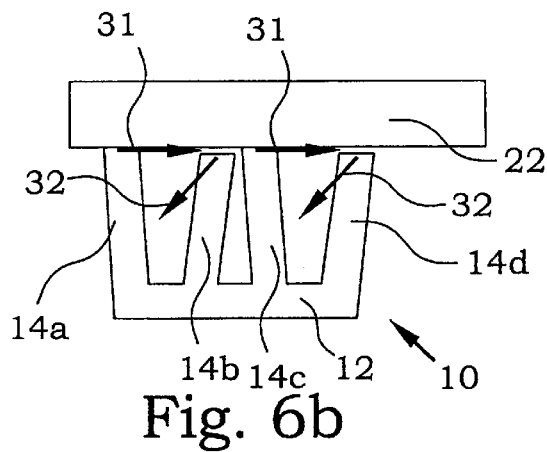

After some time, the situation in FIG. 6b is reached. The elements 14 are now changing its motion. From this situation, the elements of the first set, i.e. drive element 14a and 14c are forced in a pure tangential direction, indicated by the arrows 31. The elements of the second set, i.e. drive element 14b and 14d are instead forced in the direction of the arrows 32, i.e. in an lower left direction. Tis means that the drive elements of the second set are freely movable and that the rail 22 follows the first set to the right. This motion of the first set 14a, 14c and rail 22 continues also in FIGS. 6c and 6d.

Figure 6C:
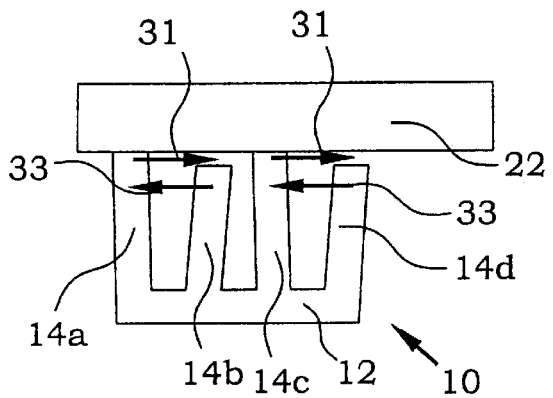
Figure 6D:
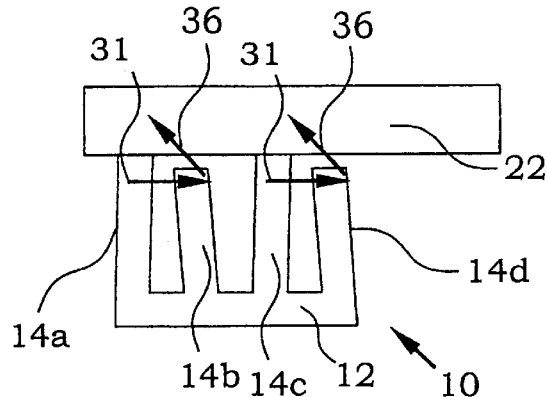

The second set, however, changes in FIG. 6c its motion to a pure tangential one 33, opposite the direction of the rail movement. In FIG. 6d, the motion of the second set again changes, now into an upper left movement 36, which means that the drive elements 14b, 14d of the second set come closer to the rail again.

Figure 6E:
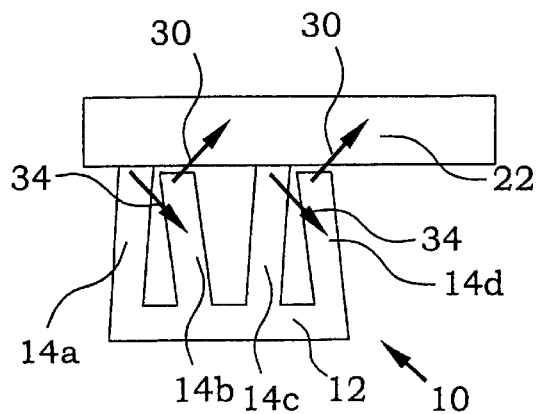

The situation in FIG. 6e corresponds to the one in FIG. 6a, except for the fact that the first and second set has changed their respective roles. A second half of the cycle may now be performed in order to return to the original positions.

The four characteristic sequences of the motion are easily distinguished also here. The gripping sequence of the first set and the releasing sequence of the second set start at FIG. 6a and end at FIG. 6b. The moving sequence of the first set and the returning sequence of the second set take place between FIG. 6b and FIG. 6e. The first set is now ready for its release, while the second will start to grip.

It is a further advantage if the tangential speed component during the gripping and releasing sequences are equal to the tangential speed of the moving sequence. This leads to a constant uninterrupted even motion of the rail during the entire cycle. The returning sequence, however, does not have to present a certain speed, since the elements then are freely movable. However, the speed has to be somewhat higher than in the other sequences in order to reach the start of the gripping sequence in time.

The normal speed in the grip and release segments are partially determined by the available motion range, height errors and desired step length. The normal speed and normal ideal displacement of the element will result in an impact normal to the rail This impact will typically create an acoustic wave in the rail (as well as in the element) and might cause wear. A reduction of acoustic emission is often desired, in particular at frequencies below 20 kHz, and it is thus important to minimize the mechanical impact. Neglecting the height error, we would typically choose to have a smooth normal approach during grip, e.g. acceleration in the normal direction, to minimize the mechanical impact. To reduce the acoustic emission we prefer to have counteracting forces, displacements and wave formation, e.g. that one element set is gripping at the same time as the other is releasing. The velocity schedule thus comprises counteracting motion of the two different element sets in a direction substantially perpendicular to the surface of the body to be moved. The normal speed control during grip and release is used to reduce mechanical impact and acoustic emission. The voltage wave form is adapted by control electronics, described more in detail below. The adaptation can be performed by simply testing different voltage wave forms and selecting the one giving the lowest noise, i.e. a pure trial and error procedure. However, in many applications, the properties of the elements, their surfaces and the rail are well known and more or less scientific models can be constructed, which then may be optimized empirically.

The phase difference between the two drive element sets is normally 180 degrees to get as stable and smooth behavior as possible, This means that the behavior is identical for the two sets in comparison with each other. It is, however, sometimes advantageous to adjust the phase difference to improve performance and typically it could be suppression of an undesired resonance. The cycle fraction for the return segment determines the position relation of the two element sets. If we for instance consider motion at very low speed with a very fast return segment and a 180-degree phase difference between the element sets, one element set would essentially be in position E when the other would arrive at position C. This could be considered one extreme choice and the other extreme would be to have a return cycle fraction of 50%, i.e. equal to the grip, move and release cycle fractions. In the first case both element sets are most of the time moving the rail together giving e.g. high tangential force capacity and stability. In the other case, typically with low normal forces and good flatness (height errors of rail and element contact points), very simple drive cycles can be used, which is advantageous when cost has to be minimized. One example is a simple rhomb and often the maximum motion range 40. The drive cycle that often is the best compromise is the trajectory 48 given in FIG. 4a with one element set in position C when the other set is in position F. The grip and release sequences are made at the same time, while the tangential speed is kept controlled as desired.

In non-dynamic and pseudo-static motion mechanisms, at least one set of elements is in contact with the body to be moved. This means that the motion cycle is possible to interrupt at any stage, without loosing the control of the motion. In this way, microstepping is possible, i.e. steps shorter than the step length are possible to take. The position resolution will in microstepping mainly depend on the relative voltage resolution and the step length. By having fine controlled voltage, a fine stepping is possible.

Figure 4C:
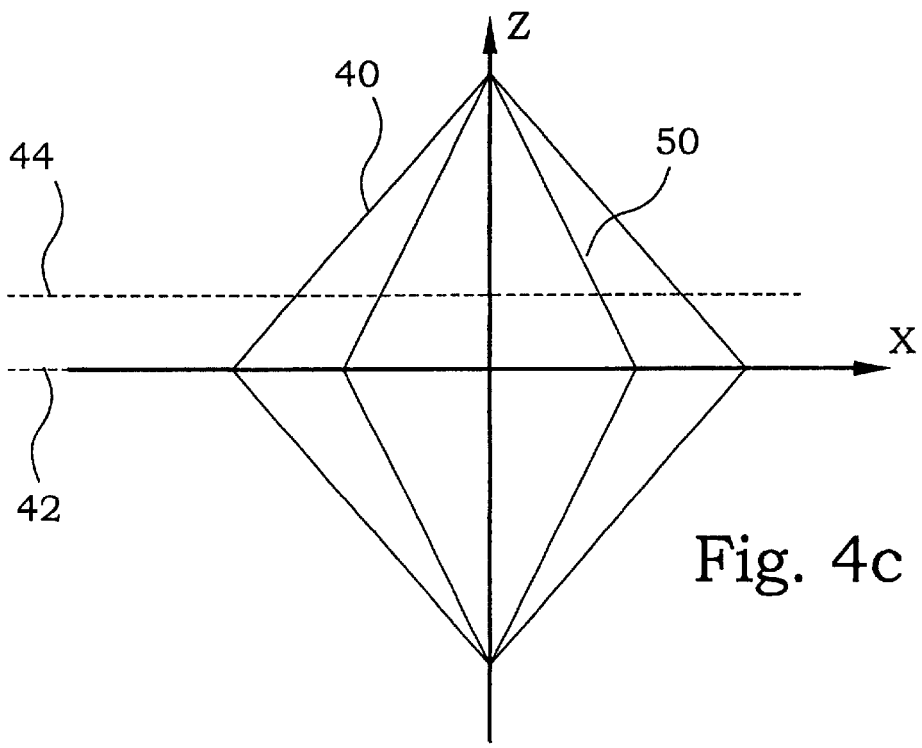
FIG. 4c is a diagram illustrating another motion trajectory according to the present invention.

In FIG. 4c, there is also an inner rhomb 50 drawn within the outer rhomb 40. The inner rhomb 50 represents a motion area for controlled reduction of step length. The step length should be chosen both with respect to parameters such as the resolution in the application, surpression of vibrations as well as the angular tilt of the drive element tip. The tilting might influence the performance in a negative way and one solution is to make the tips rounded to get a smooth contact. Another solution is to make smaller steps, i.e. using element tiltings which are smaller. The shape of the drive element tip is important also for the elastic deformation close to the contacting area and too small a radius might result in too large elastic deformation. The possibility to drive the motor at a double frequency with half step length makes it possible to surpress e.g. vibrations in motors or other mechanical details. Major importance with being able to adjust the step length is that fine positioning becomes simpler and more accurate. By making smaller steps than the desired positioning resolution, a controller can simply make full steps until the desired position has been reached. There is no need to keep track of both the number of full steps and the number of microsteps necessary to reach the desired position, as in the case of a microstep mode. Since there are always some type of positioning error associated with grip and release as well as factors such as time dependent creep, a reduced step mode is more stable than the microstep mode. When the last step is made the voltages could be chosen to zero and no more positioning changes of the kind associated with the microstep mode occurs. More details about positioning at the use of microstepping is given further below.

In the general motion case the time dependent position vectors r(t) in the x-z plane describing the non-loaded trajectory for both element sets should be possible to change at every instant to get full freedom in motion. To a certain extent this is possible with present analogue and digital electronics, but it is seldom necessary to have this freedom. There are rather some special cases that have to be considered carefully.

One of these is acceleration/retardation and to exemplify we will describe an acceleration sequence. The rail with its inertial load can not be accelerated faster than the force from the elements allow. There are two extreme cases, smooth or maximum acceleration, to consider. The maximum acceleration is achieved with both elements in contact with the rail most of the time and essentially the elements grip at C) and moves fast to G to achieve maximum force. This does only work at low speeds. The return sequence is even faster and the two element sets operate more or less with 180 degree phase difference. This type of acceleration routine has drawbacks regarding both wear and noise. If instead the acceleration is made during the pure moving sequence D to F, gripping and releasing can be made at reduced relative speed between the two element sets which is advantageous from e.g. a wear point of view. A fairly high acceleration can be achieved by a higher acceleration in the beginning of the moving sequence so that the element is more or less in phase with the ideal unloaded trajectory 48 at position F.

Another easy routine is to change the speed once every step, at for instance position D and allow a minor relative speed difference between the two element sets during grip and release, since the element will not move along the unloaded trajectory during acceleration. In general, acceleration control during the various segments in the drive cycle gives the possibility to optimize the motors for every application.

Fine walking in this invention regards both the possibility to stop at each position in the trajectory, which means that an arbitrarily fine resolution can be achieved with the right control electronics, and the freedom in choosing step length, time for grip/release and overlap. Even if the analogy is not complete with a stepping motor, there is also a possibility of driving the motors in a micro-step mode. In an electromagnetic stepping motor, the current is controlled so that each step can be divided in fine increments. If we consider a voltage control of the present motor, a fine adjustment of the voltages in the two phases in a bimorph provides the possibility to stop at each position along the chosen trajectory, i.e. a piezoelectric micro-stepping.

In FIGS. 4a–4c the trajectories for the element tip have been shown without any normal or tangential load. When the drive unit is pressed against a rail with a normal force there will in most cases be a non-negligible deformation of the drive unit and other components that can not be considered as springs creating the normal force against the rail. By using the drive unit passive part as a position reference, the trajectories with a normal load could be considered somewhat reduced in the z-direction when the element is in contact with the rail during realistic situations. At high tangential loads, there will also be a difference between the trajectories for unloaded and loaded conditions. Depending on how the gripping with one element set and the releasing with another set is made, the element tip will be shifted/distorted in the x-direction during the gripping sequence. The shifting direction depends on the tangential load direction. A possible trajectory during a realistic situation would look like the trajectory 49 in FIG. 4a.

The velocity vector of the element tip given in x-z coordinates highly depends on load conditions and how the grip and release sequences of the two element sets are synchronized. It is more convenient to consider the forces necessary to create the desired motion in a loaded case, and adjust the time dependent trajectories of the two element set to optimize the performance With an external tangential load or during acceleration/ retardation, the force applied by the element tip during gripping will have both a normal component and a tangential component. At constant velocity and no external loads, there will be only a normal force component. Characterizing for the motion principle of the present invention is that the element tip has a certain non-zero tangential velocity at the moment of element set exchange.

Other aspects to consider in most motors are the stopping and holding routines. With some type of spring force pressing the monolithic unit against the rail, the holding capacity is more or less independent of the position of the drive elements. It is rather more important to have close to zero relative movement of both elements to keep position and reach a high friction. Since most of the electromechanical materials with high strain capacity suffer from creep, aging etc. it is important to stop the motion in a way that the movement at hold/stop position is negligible. Two such positions are either when the voltage is turned off or when the voltages are applied in such a way that the two element set are counteracting in a symmetrical way, a symmetric antagonistic balance. The voltage should preferably be tamed off in the E position so that both bimorph sides have equal electric fields and the movement of the drive element contact point will follow a straight line down to position A. The elements could also remain in the high-voltage symmetry position E if there is no problem leaving the voltage on. To get into an antagonistic balance, the two element set should be positioned at symmetric positions relative the central line A–E. To include also time dependent effects the sets could also move in different directions, e.g. one set moves clockwise and the other counterclockwise. A typical solution is though that one element set follows the trajectory 48 e.g. clockwise and stops at a position in between D and E. The other set then moves to position G counter-clockwise and then makes a movement along the line G–C to reach the mirror imaged x-position of the first set. Thereafter, the second set moves parallel to the z-axs to reach the symmetry antagonistic position. The creep, aging etc. of the two set will therefore effectively be cancelled. The controlled positioning of the Clement sets to approach antagonistic or stable positions for stopping or holding is essential for fine positioning.

The possibility to adjust the step length is very advantageous for fine positioning. If the step length is adjusted so that the drive element reaches the desired position very close to the E position instead of somewhere between C–E or E–G, the drive element can directly be turned off with limited shifts in tangential position. The adjustment of step length could either be made continuous or at the last step before the desired position is reached.

In order to achieve extremely small step lengths, the motion of the present invention can be used in closed-loop applications with a suitable position sensor. It is easy to perform a well-controlled motion in a closed-loop control program if the step length is very small compared to the requested resolution. Equal size of the steps and motion without play is also important. By using microstepping a closed-loop positioning application can not be sure to reach the requested position within one single step, and the microstepping procedure might have to cross into the subsequent step in order to reach the requested position. Closed-loop controlling refers to procedures, where a position sensor gives an actual position, and where the regulating routine compares the actual position with the requested one and controls the further motor motion in order to minimise the difference.

There are several solutions for the electronics available to be able to make the controlled fine walking as has been described previously. One possible solution is to generate the desired waveform description digitally. A digital/analogue converter and amplifier is then used to create the corresponding voltage waves.

One embodiment of an amplifier circuit suitable for this is given in FIG. 7. A linear amplifier 63 drives a motor phase, illustrated as a capacitor 64. The linear amplifier 63 is in general a circuit in itself. Preferably, the amplifier 64 has a built in or external low-pass filter to avoid resonance in the motor or other component. The linear amplifier is driven by a digital to analogue converter 62, which gets the digital definition of the voltage wave from a integrated circuit 61. The IC is preferably a programmable logic circuit such as a FPGA (Field Programmable Gate Array) to make it easier to optimize motors for each application. The choice of voltage control of the motors has several advantages, including stability and simplicity. One important advantage is that the circuit can be used to damp various unwanted motion modes since the motor phase can be considered connected in short-circuit at a given voltage. By proper choice of impedance of the amplifier, various undesired motion modes can be damped. The parallel architecture of a PPGA makes it easy to run complicated optimization sequences, where all phases has to be changed each cycle or even oftener. The economical circuits available today are able to drive a motor at a cycle frequency of 100 kHz with a cycle resolution of more than 256 micro-steps per cycle. This corresponds to a clock frequency of about 25.6 MHz. The voltage definition could be made much better, and will not limit the resolution of the motor. With a clock frequency of 500 MHz, which is available today for a slightly higher cost, the micro-step resolution will improve with a factor 20.

The two different fine walking mechanisms, reduced step length and micro-stepping with the IC, can both be used to achieve a high positioning resolution. The ultimate resolution will be determined by the relative voltage resolution related to the maximum step length. For example, with a maximum step length of 1 $\mu$m at 50 V, a 12-bit voltage resolution corresponds to an ultimate positioning resolution in the Å range (12 bits for half a step). In the micro-step mode the resolution will be twice the step length divided by the cycle resolution, since there are two steps per cycle. To optimize the resolution the reduced step length is preferably chosen to compensate for a lower cycle than voltage resolution. It is also possible to define steps with reduced step lengths close to the ultimate resolution, which is advantageous when creep and other undesired motions should be reduced to a minimum. Generally, creep etc. are fractions of the full stroke and with reduced stroke undesired motions are decreased.

Figure 8:
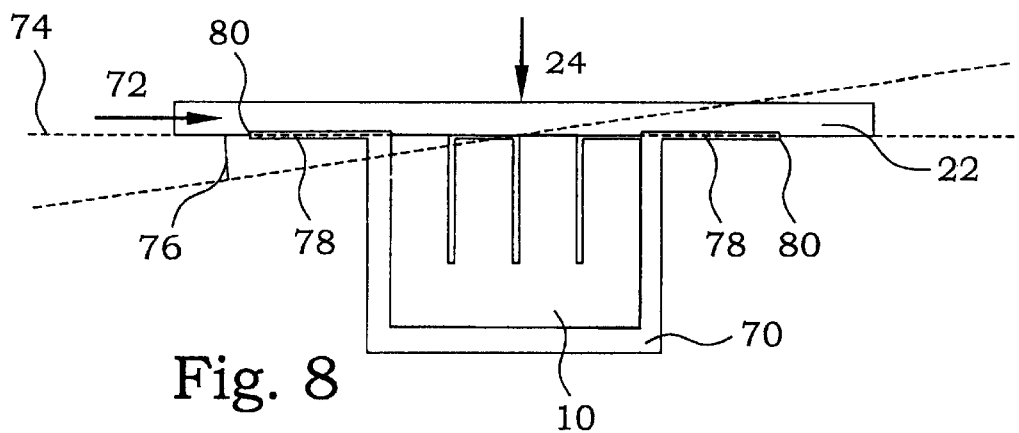
FIG. 8 illustrates an embodiment of a preferred mounting of a drive unit.

There are numerous ways of building operating motors with monolithic drive units such as the one shown in FIG. 1. Two particular cases can be distinguished, significant or negligible loads, and the mechanical solutions for these cases will be further explained below. The non-dynamic mechanism used in the present invention puts particular demands on mechanical stability during operation. All drive element (contact points) have to be able to get in contact with the rail at the predetermined position. If we consider a rail that is guided in such a way that the maximum angular error 76, illustrated by a broken line in FIG. 8, is small enough to allow controlled operation of the motor, the main demand will be on the details creating the normal force N 24 when a tangential force T 74 is applied If a spring 78 is used, a tangential force might rotate a mounting module 70, in which the monolithic actuator unit 10 typically is fixed. The mounting module 70 could be made of steel or other robust materials. If the springs 78 have a mountings point 80 on or close to the contact plane 74 between the monolithic actuator unit 10 and the rail 22, the rotation of the mounting module 70 will be greatly suppressed. Preferably, the whole spring 78 should be placed in the contact plane 74. To keep control of position in the tangential directions the spring 78 should have as anisotropic properties as possible, i.e. sufficiently soft in the normal direction and as stiff as possible in the tangential directions.

Figure 9:
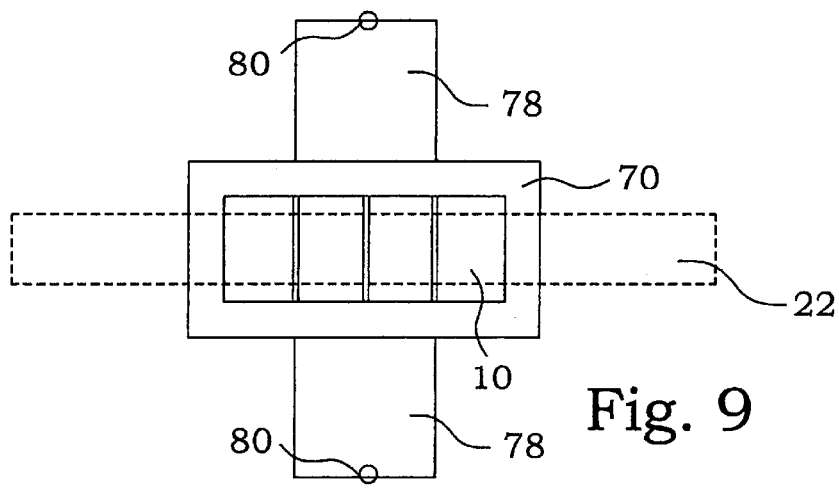
FIG. 9 illustrates a top view of an alternative mounting of a drive unit.

One example of how to achieve desired normal forces and at the same time high stiffness in the tangential directions is to use a flat spring 78 in or close to the contact plane. Another desired property of the spring 78 is the ability to align the module against the rail automatically. It is preferable to mount the whole mounting module 70 and spring 78 into a machined house and get operation without any adjustments. This can be achieved with the springs 78 given in FIG. 8. The bending stiffness of e.g. flat springs 78 in the contact plane 74 can be adjusted so that the contact points of the drive elements in the module will be able to align themselves parallel to the rail surface, i.e. the spring will have auto-aligning properties. In FIG. 9, a mounting module 70 with springs 78 is shown in a top view, with the rail 22 indicated with broken lines. The mounting points 80 are in, or close to, the contact plane but placed orthogonal to both the normal and tangential direction of the rail 22 motion and preferably symmetric with respect to the mounting module 70.

What should be emphasised once again is that several different monolithic units can be used, which gives advantages in various applications. In these last examples, a unit consisting of four drive elements, where the bimorph phases are place orthogonal to the ones shown in FIG. 1, could advantageously be used. The drive element would then tilt sideways instead of lengthways and the module could be oriented orthogonal to the rail instead of parallel. The module would in such a case be less sensitive to tilting errors of the kind exemplified in FIG. 8, since the height difference relative to the rail becomes equal to all drive elements.

Figure 10:
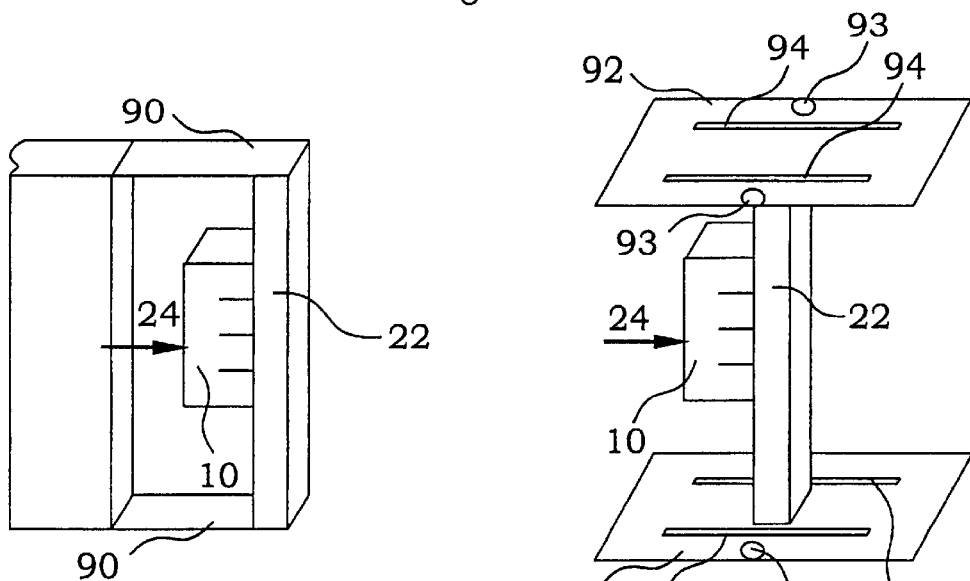
FIG. 10 illustrates a motor arrangement suitable for small strokes.
Figure 11:
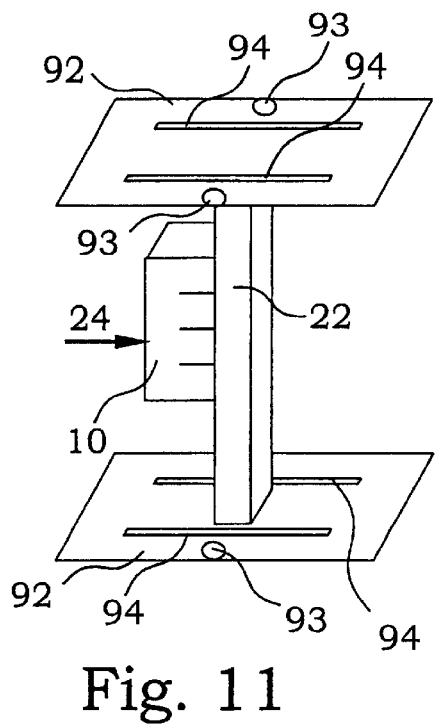
FIG. 11 illustrates another motor arrangement suitable for small strokes.

A simple guiding of the rail for small strokes is constituted by an arrangement of parallel springs, i.e. double-cantilevers. It could be either two parallel cantilevers 90 as exemplified in FIG. 10, where a unit 10 is pressed against the rail 22 with a normal force 24, creating a reaction force by the expansion of the spring in the normal direction, The force necessary to bend the cantilevers is much smaller and allows for small to moderate strokes depending on spring length. Another version to reduce the motion in the normal direction is to use antagonistic arrangements as in FIGS. 8 and 9 or to make symmetric leaf springs 92 as the one given in FIG. 11. In this embodiment, the springs consist of leafs with slits 94. The slits 94 in the leaf 92 make the leaf act as several cooperating and antagonistic double-cantilever beams and operates in at least one direction perpendicular to the leaf normal. The leafs 92 are mechanically fixed to the supporting structures at points indicated by small circles 93, i.e. essentially in front and in back of the picture as drawn. This double cantilever beam arrangement which substantially reduces parallel shifts of the beam with tangential motion gives a large stroke without much space requirements.

Figures 12, 13:
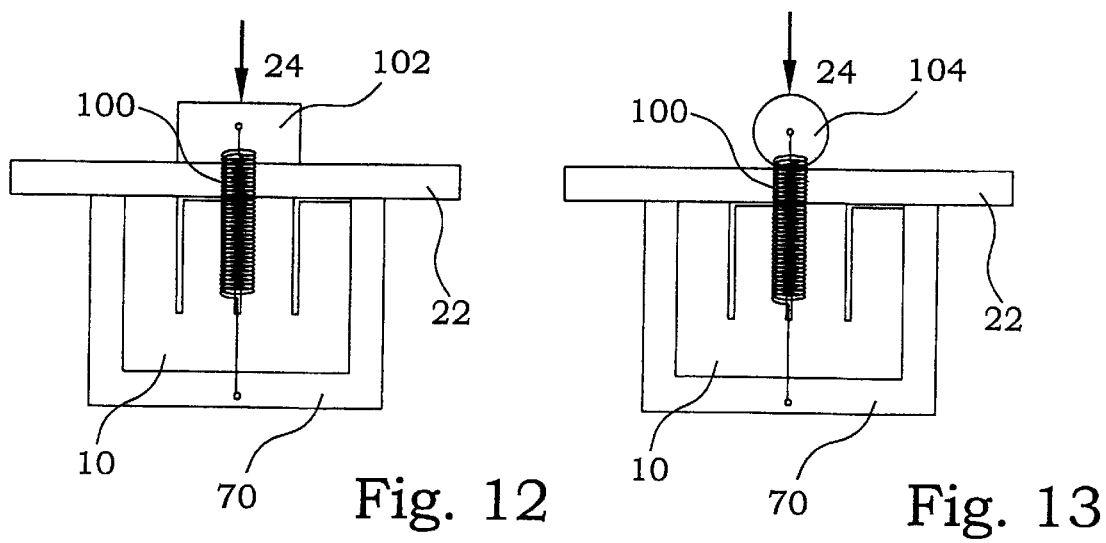
FIG. 12 illustrates an embodiment for application of a normal force.
FIG. 13 illustrates another embodiment for application of a normal force.

For negligible loads it might not be necessary to have a particular guiding of the rail to get controlled motion. The rail tangential position is essentially defined by the fine walking and only simple details have to be used to keep the rail in position in the orthogonal directions. It is sufficient to supply a normal force without creating to high a tangential force. One very simple solution, as the one shown in FIG. 12, is to use a linear bearing 102 with a low friction coefficient pressed against the rail 22 with a normal force 24. The bearing 102 material could be e.g. a PITFE polymer. The normal force 24 could be created with simple springs e.g. helical springs 100 attached to a mounting module 70 of an actuator unit 10 or other mechanical parts. Other types of springs, e.g. leaf springs, with higher stiffness in the tangential direction might be needed in some applications. A somewhat more expensive solution, shown in FIG. 13, is to use a ball 104 or slide bearing to supply the normal force without creating too high tangential forces. The force itself can be adjusted with helical springs 100 or even rubber materials if the bearing 104 is fixed to the mounting nodule 70 by some mechanical means not shown in the figure. The rubber could be o-rings fitted to the bearing. The simple solution to keep the rail 22 in position orthogonal to the tangential direction is some type of profile on the bearings. Further, several ball or roller bearings could be used. Several ball bearings could be put along the rail. An alternative is to have -free balls or rollers that are kept against the rail to be moved by another fixed profiled rail that keep the rollers/balls from moving sideways or too far lengthwise.

What should be realized is that at miniature scale, the motion range is only in the micrometer order and the rail surface has to be extremely flat. Also the height of the driving elements have to be adjusted within very small tolerances. The flatness of the rail can be made with conventional lapping and polishing techniques while the polishing of the monolithic unit has to be made according a particular procedure depending on the material chosen. A piezoceramic material should be polarized before final polishing to avoid shape changes of the material in the polished state, This is not the common technique since the monolithic unit then has to be polished with the electric carriers attached, which normally is not desired. A soft piezoelectric material does not necessarily need to be polarized before use since a short run-in will give the desired polarization. In simple motors, the drawback of uncontrolled height of the drive elements can be compensated for by the cheaper polishing sequence, and in this case our preferred solution is to not polarize the motor before use.

The exact choice of the time dependent speed vector at "grip" and "release" as well as the overlap time between the two drive element sets is crucial for optimized performance, and these aspect has been further discussed elsewhere. If we consider the energy consumption of a non-dynamic motor, the normal motion will always be related to losses, since the losses in the materials are not negligible, even with the most ideal drive electronics. The control of the surface flatness of both rail and contact points is therefore necessary also for efficiency purposes. The choice of materials properties in the rail is important for an optimal performance. A high Young's coefficient is advantageous for both reduction of elastic deformation in the contact points and to be able to keep a high flatness at high normal forces. Depending on application the wear of the rail might be critical, in particular when wear edges might be created. It is therefore advantageous to use a rail with higher wear resistance than the contact points of the drive elements. There is another method of reducing wear of the rail as well as of the contact points of the drive elements and at the same time reducing the need for high normal forces. The molecular forces between two surfaces become important when the spacing is very small, less than about ten nanometers, and this effect is often called "gauge block effect". With the use of a suitable gas or liquid, e.g. a lubricant, between the rail and contact surfaces of the drive elements, a high friction force can be achieved at moderate or zero normal forces without causing any wear of the surfaces. This is useful in a non-dynamic motor with extremely flat surfaces.

To be able to reach the tangential force needed in a specific application, the normal force and the friction properties between the rail and drive element contact points have to be designed properly. For most hard and stiff materials suitable for rail and drive elements the normal force has to be chosen much higher than the tangential force since the friction coefficient is less than one. Some materials though, e.g. rubber, have a rather high friction coefficient and is therefore advantageous in certain applications. The thickness of the rubber with its rather low stiffness has to be small enough to allow the drive elements to move freely. Another possibility with many advantages is to use teeth on both rail and drive elements. The normal force can then be substantially reduced and the wear will as well be reduced. A main advantage of using teeth is that open-loop positioning can be made with high precision and accuracy. The teeth can be fabricated with standard micro machining techniques of today.

There are several aspects to consider when designing a non-dynamic motor for high performance. One important aspect is the losses in the materials, which result in an increased temperature in the material. Since, for instance the piezoelectric effect disappears above the Curie temperature of a ferroelectric material, the temperature has to be kept below this limit. Most of all an increased temperature will give a heat expansion of the material, increase diffusion of various elements and affecting any polymeric components negatively. It is therefore a desire to control the temperature in the monolithic unit and one way of doing this is to add electrode layers in the passive backing since the metal has a much higher thermal conduction. Normally these layers would be connected to the earth electrode. The major cooling paths in a non-dynamic motor of the kind presented here are through the drive elements to the rail and through the electric connections to the unit. Using an integrated contact material with high thermal conduction, also the cooling path via the rail will be improved.

Figure 14:
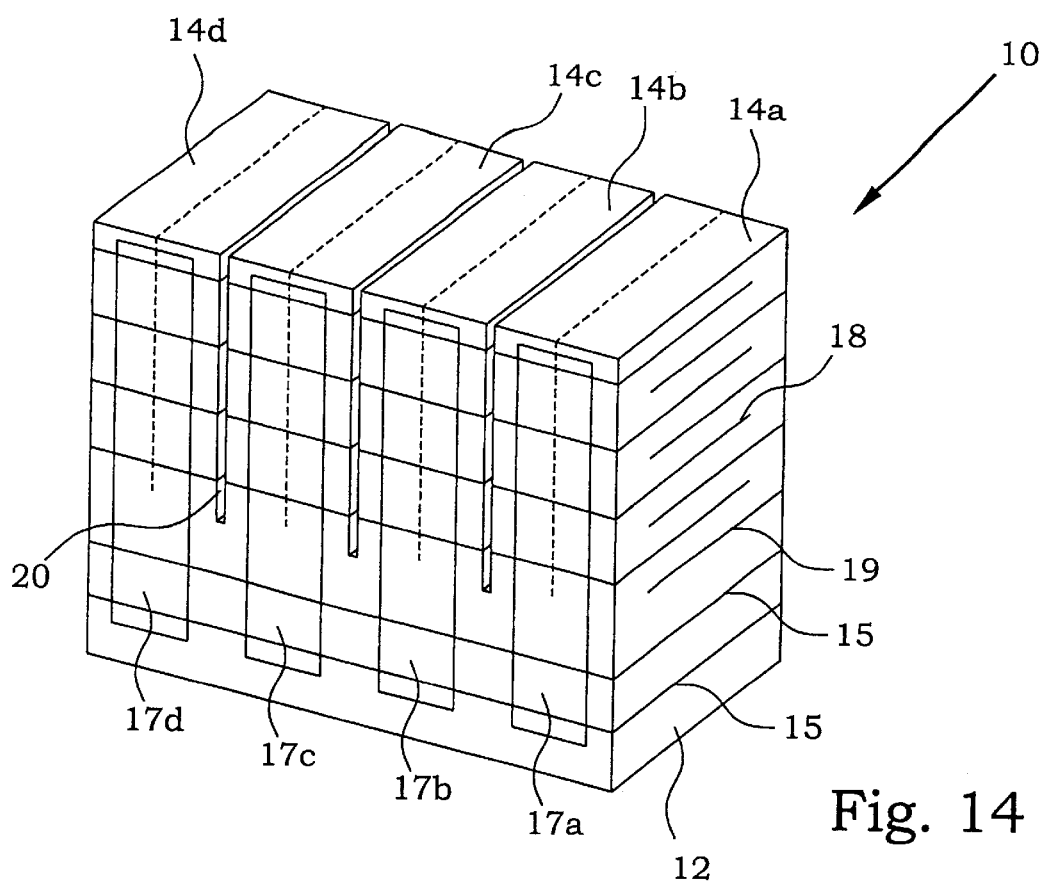
FIG. 14 illustrates an embodiment of a piezoelectric unit having contacting electrodes in the passive backing.

An important step in the fabrication sequence is to connect the monolithic unit electrically. There are several methods that can be used and there are advantages and disadvantages with each of them. As have been suggested in the international patent applications PCT/SE00/00063 and PCT/SE00/00064, the unit can be mounted on a flexible printed circuit board by either mechanical or joining techniques. As have been disclosed in PCT application PCT/SE00/00064, the contacting could be made by spring forces in the flexible carrier, which would allow for disassembling after e.g. polarization. A permanent solder joint could be made at a later stage. The common surface mounting technique of screen-printing or dispensing of the solder prior to placing the component, in our case a monolithic unit, on top of the flexible carrier is highly advantageous in large-scale production. The monolithic unit could be put with the driving elements normal to the flexible carrier or parallel to the flexible carrier. One advantage with the normal placement is that electrodes on both sides, both phase and earth electrodes, of the monolithic unit can be contacted easily at the same time. The disadvantage is that the whole unit will have a polymer as mechanical support in the normal direction. If the monolithic unit is placed parallel to the flexible carrier surface, there is the possibility to have a rigid and stiff support on the backside. In this case the earth contacting has to be made at the same side as the phases or there has to be some smart contacting to the backside. If we consider FIG. 14, the backside of a unit 10 similar to the one shown in FIG. 1 is seen. Additional electrode layers 15 have been introduced in the passive backing part 12. These layers are used to make it possible to contact earth electrodes 17a–d from the (not shown) "front" side of the unit 10. Another solution is to divide the flexible carrier so that one portion of the carrier can reach the other side. There are several details to consider regarding the final contacting against the flexible carrier. In some applications, the earth electrodes 17a–d should preferably be divided in the same manner as the phase electrodes 14a–h (FIG. 1), which also could reduce the number of masks needed in a screen-printing process.

The earth electrodes could as well be completely separate which in this example would end up with a 16-wire motor. Normally the earth electrodes are connected, though, and there are two main wire alternatives. Either all phases are kept separated, which gives a 9-wire motor, or the phases belonging to the sets operating synchronously are connected, which gives a 5-wire motor. A 5-wire motor can be considered as a 4-phase motor. If we consider one of the phases in element a, this phase is connected to another phase in elements c or in d. The first alternative gives the same distance between the driving elements operating synchronously and the second alternative gives a symmetry regarding the center of the unit. The center symmetry arrangement, i.e. the left phase in the a element is connected to the left phase in the d element, the right phase in the a element is connected to the right phase in the d element etc., is preferred. With an 8-phase motor (9 wires) it is possible to make minor adjustments of height position, due to fabrication errors etc., of the different element contact points by the addition of a bias voltage to the corresponding phases. For instance, if the drive element a is found to be 0.1 μm below desired value, a bias voltage corresponding to this elongation can be added to phases a and b in this element for compensation.

It will be understood by those skilled in the art that various modifications and changes may be made to the present invention without departure from the scope thereof, which is defined by the appended claims.

APPENDIX 1

Several different motors based on electromechanical materials have been proposed and some of these have been commercialised. To distinguish the various driving mechanism that has been disclosed in various articles and patent applications, the mechanisms can be divided according to physical principles and in particular regarding the importance for miniature motors. Further sub-divisions are possible. A brief description of the different mechanisms is presented below.

The first division of driving mechanisms is made between dynamic mechanisms and non-dynamic mechanisms. By using the inertia of some motor component and/or time dependent physical effects, various electromechanical motors based on dynamic mechanisms can be realized. Typically, the motors can only operate in a certain frequency range with no operation at low internal speed or frequency. The commonly encountered names ultrasonic and travelling wave motors belong to the group dynamic mechanisms where the latter is a particular example of a motor based on mechanical resonance.

The main part of motors constructions disclosed are based on mechanical resonance of either the piezoelectric material itself or a structure mechanically coupled with the piezoelectric material. The driven component is moved by intermittent cyclic contact with the resonating surface or elements. In a travelling wave motor there will always be contact between the driven component normally a rotor, and some of the resonating elements. The major interest in this mechanism is connected to the potential for energy saving and motion magnification. An active structure in resonance can move with little consumption of energy, which theoretically could be used in a highly efficient motor. Depending on how easy it is to bring the structure in resonance, a smaller or larger motion amplification can be obtained. Motion magnification is important when the dimensions are reduced and the clearance between the mechanical parts is small. Disadvantages in practice are the relatively high wear and difficulties in approaching a large motion range of the resonating parts without failure.

Some motors use inertial effects. The driven component is moved by intermittent friction contact with the actuator element in a cyclic manner. The inertia of the driven component, or some other parts in the motor, is chosen so that the actuator elements are able to move freely, normally by fast and two-dimensional motion, to another contacting position. One cycle consists of creating dynamic contact, movement of the driven component, dynamic release and return to start position. The dynamic nature makes it necessary to keep the cycle frequency within a certain range. The inertial mechanism will become an impact mechanism if the contacting time is short in relation to the cycle time. One important advantage with this mechanism is that in applications with short lifetimes and medium forces there are moderate demands on the surface to be in contact. Due to the dynamic motion this mechanism are inferior to a non-dynamic mechanism regarding positioning and resolution.

Stick-slip mechanisms are particular inertial mechanisms where the increase in friction coefficient at zero relative velocity between actuator elements and the driven component is utilised. Two-dimensional motion of the actuator elements is not necessary in this case. Since the friction coefficient (normally) is higher at zero relative velocity, the desired motion of the driven component is made with the actuator at a force less than the slipping force. The actuator is moved back at high speed with an initial high acceleration. The acceleration of the actuator is chosen high enough to case slippage between actuator and component to be moved. The inertia of the driven component is hence utilised. The main advantage is the simple construction and the main disadvantages are the wear of the components and the uncontrolled nature of the mechanism.

In particular early constructions presented or disclosed for piezoelectric motors were based on impact mechanisms. Generally, a part of the mechanical momentum is transferred from an oscillating actuator to the moving part. An advantage is an easy construction but there are several disadvantages including problems with changing direction of motion and wear.

The non-dynamic mechanisms are characterised in that the motion can be made at arbitrarily low frequencies or speed of the active elements. The driven component is moved by actuator elements which make motion cycles consisting of sequences such as grip, move, release and return. When one element (set) is releasing, another (set of) element will grip the driven component. This means that at least two gripping elements (or groups of elements) have to be provided, configured for providing an alternating gripping—releasing function. The upper limit of the non-dynamic mechanisms is typically a cycle frequency where mechanical resonance of the actuator elements will substantially influence the movement of the elements, i.e. the quasi-static limit. Typically the non-dynamic mechanisms are advantageous where controlled positioning is desired at low to medium-high speeds. Further this mechanism allows for easy optimisation in various applications and gives the possibility to deliver high forces. The main disadvantage is the demands on the construction in order to achieve the desired mechanism. Various solutions to simplify the constructions without losses in performance are therefore of great commercial interest. The below disclosed mechanisms for non-dynamic motion are the inchworm mechanism and a mechanism utilising cilia drive elements.

In the "inchworm" mechanism, the driven component is moved by mechanical steps in a clamp-extend-clamp fashion. There has to be at least two sets of clamping elements that move out of phase. The clamping elements are connected to a central extention tube that move the driven component In between each motion, the extention, the driven components is clamped by both sets of elements and stands still.

With use of a cilia drive elements, mechanical stepping can be made with drive elements that are only able to move one-dimensionally. Essentially two sets of elements operating out of phase are needed. One set is able to move in a direction in between the normal and tangential direction. The other set is also able to move in a direction in between the normal and tangential direction, but typically mirror imaged, with respect to the normal axis, relative the first set. If the first set is raised the driven component is moved both normally and tangentially. The second set is raised to contact the driven component and then the first set is lowered. When the second set is lowered the driven components moves in the same direction as was achieved with the first set. Change of direction is achieved by change of phase between the two sets.

It is also possible to create motion by mechanisms that are essentially non-dynamic in the contact with the body to be moved, but involves certain parted with a dynamic character. Such a mechanism can be used for controlled walking and is based on two sets of elements where the set in contact with the driven component is operating (quasi-) static and the set which is not in contact with the driven component is operating in a more dynamic manner. Typically, the elements which are not in contact with the driven component use the inertia of the element and/or other components to make a fast return from a release to the grip sequence. The driven component can hence be moved at arbitrarily low speeds but the frequency or speed of the return sequence has to be sufficiently high for the element to be able to move freely. Such a mechanism can be called pseudo-static.

What is claimed is:

1. Method for driving an electromechanical actuator arrangement to move a body in a main motion direction, said method comprising the steps of:

driving a first set of drive elements in a four cycle sequence of: gripping said body, moving said body, releasing said body and returning said first set of drive elements to an original position;

driving a second set of drive elements in a four cycle sequence of: gripping said body, moving said body, releasing said body and returning said second set of drive elements to an original position;

said driving of said second set being phase shifted related to said driving of said first set, said second set being exclusive to said first set, and at least one of the sets is in contact with said body surface at each instant;

said gripping sequence of said first set overlaps during a non-negligible transfer period with said releasing sequence of said second set, such that both said first and said second set of drive elements are simultaneously contacting said body, and said gripping sequence of said second set overlaps during a non-negligible transfer period with said releasing sequence of said first set, such that both said first and said second set of drive elements are simultaneously contacting said body; and said driving of said first and second set of drive elements during said gripping sequence includes a significant velocity component in said main motion direction.

2. Method according to claim 1, wherein said velocity component in said main direction of the drive elements of said first set is substantially the same as said velocity component in said main motion direction of the drive elements of said second set, during said transfer period.

3. Method according to claim 1, wherein said steps of driving in turn comprises the step of controlling the velocity components in said main motion direction of said driving portions of said drive elements during said gripping, moving and releasing sequences according to a velocity schedule.

4. Method according to claim 3, wherein said velocity schedule comprises sections of constant velocity in the main motion direction.

5. Method according to claim 3, wherein said velocity schedule comprises counteracting motion of the two different element sets in a direction substantially perpendicular to the surface of the body to be moved.

6. Method according to claim 3, wherein said velocity schedule comprises sections of acceleration and sections of retardation.

7. Method according to claim 1, wherein said steps of driving in turn comprises the step of displacing said driving portions of said actuator elements during said moving sequences substantially along said main motion direction.

8. Method according to claim 1, further comprising the step of dividing each of said cycle steps into micro-steps, whereby said driving steps are interruptible at each of said micro-steps, for increasing the resolution of the driving motion.

9. Method according to claim 8, further comprising the step of moving said driving portions of all actuator elements into contact with said body surface, when said driving steps are interrupted.

10. Method according to claim 1, further comprising the step of reducing the cycle step length of said first and second sets as compared to the maximum step length possible.

11. Method according to claim 1, further comprising the step of interrupting the driving sequence when the voltages in the two phases of the driving element set are substantially similar.

12. Method according to claim 1, further comprising the step of driving drive elements of additional sets of drive elements in the fours cycle sequences of: gripping said body, moving said body, releasing said body and return to the original position.

13. Electromechanical actuator arrangement, comprising:
a plurality of drive elements, driven according to a walking mechanism;
a body to be moved in a main motion direction, whereby a driving portion of said drive elements being independently movable along and perpendicular to the surface of said body;
driving means for driving a first set of drive elements in a four cycle sequence of: gripping said body, moving said body, releasing said body and returning said first set of drive elements to an original position, and for driving a second set of drive elements in a four cycle sequence of: gripping said body, moving said body, releasing said body and returning said second set of drive elements to an original position, said driving of said second set being phase shifted related to said driving of said first set, said second set being exclusive to said first set, whereby at least one of the sets is in contact with said body surface at each instant;
said gripping sequence of said first set overlaps during a non-negligible transfer period with said releasing sequence of said second set, such that both said first and said second set of drive elements are simultaneously contacting said body, and
said gripping sequence of said second set overlaps during a non-negligible transfer period with said releasing sequence of said first set, such that both said first and said second set of drive elements are simultaneously contacting said body; and
said driving means in turn comprises means for driving said driving portions of said first and said second set during said gripping sequence with a velocity having a significant component in said main motion direction.

14. Electromechanical actuator arrangement according to claim 13, wherein said drive elements are active portions of a monolithic body connected by passive portions of said monolithic body, and that said passive portion further comprises additional electrode layers.

15. Electromechanical actuator arrangement according to claim 14, wherein said additional electrode layers are connected to ground, for improving thermal conductivity.

16. Electromechanical actuator arrangement according to claim 13, wherein said driving portions are made by a material with high thermal conductivity.

17. Electromechanical actuator arrangement according to claim 13, wherein said sets are substantially symmetrical with respect to the centre of said electromechanical actuator arrangement.

18. Electromechanical actuator arrangement according to claim 13, wherein said drive elements are held against said body by means of springs, mounted substantially in the contact plane between said driving portions and said body.

19. Electromechanical actuator arrangement according to claim 13, further comprising a ball bearing or roller bearing in contact with said body and spring means connected between said ball bearing or roller bearing and said drive elements, for applying a normal force to said body.

20. Electromechanical actuator arrangement according to claim 13, further comprising two cantilevers in mechanical connect ion with said drive elements, said body being mounted between said cantilevers, said cantilevers being displaceable in said main motion direction.

21. Electromechanical actuator arrangement according to claim 20, further comprising springs consisting of leafs with slits, said leaf acting as several parallel cantilever springs with counteracting behaviour in at least one direction perpendicular to the leaf normal.

22. Electromechanical actuator arrangement according to claim 13, further comprising teeth on both driving portion of the driving elements and the body to be moved.

23. Electromechanical actuator arrangement according to claim 13, further comprising a non-solid material in between the driving portions of the driving elements and the body to be moved.

24. Electromechanical actuator arrangement according to claim 13, wherein said driving means is arranged for driving said drive elements of said first and second sets with substantially the same velocity component in said main motion direction during said transfer periods.

* * * * *

UNITED STATES PATENT AND TRADEMARK OFFICE
CERTIFICATE OF CORRECTION

PATENT NO.    : 6,337,532 B1
DATED         : January 8, 2002
INVENTOR(S)   : Johansson et al.

It is certified that error appears in the above-identified patent and that said Letters Patent is hereby corrected as shown below:

<u>Title page,</u>
Item [56], insert the following:

-- FOREIGN PATENT DOCUMENTS
44 08 618 A1   09/1995 ...... Germany
0 452 731 A1   10/1991 ...... European --

Signed and Sealed this

Twenty-fourth Day of December, 2002

JAMES E. ROGAN
*Director of the United States Patent and Trademark Office*